(12) United States Patent
Litfin

(10) Patent No.: US 6,768,176 B1
(45) Date of Patent: Jul. 27, 2004

(54) ELECTROSTATIC DISCHARGE PROTECTION CIRCUIT

(75) Inventor: David D. Litfin, Houlton, WI (US)

(73) Assignee: PolarFab LLC, Bloomington, MN (US)

( * ) Notice: Subject to any disclaimer, the term of this patent is extended or adjusted under 35 U.S.C. 154(b) by 0 days.

(21) Appl. No.: 10/267,604

(22) Filed: Oct. 9, 2002

(51) Int. Cl.$^7$ .............................................. H01L 23/62
(52) U.S. Cl. ...................................... 257/355; 257/357
(58) Field of Search ................................ 257/355–367, 257/173, 175; 360/323; 361/15, 56, 58, 111, 118; 438/133–135, 140

(56) References Cited

U.S. PATENT DOCUMENTS 5,432,368 A * 7/1995 Jimenez ....................... 257/355
5,789,785 A * 8/1998 Ravanelli et al. ........... 257/361
5,850,095 A * 12/1998 Chen et al. .................. 257/361
6,268,639 B1 7/2001 Li et al. ....................... 257/577

FOREIGN PATENT DOCUMENTS

EP 785576 A2 * 7/1997 ........... H01L/27/02

* cited by examiner

Primary Examiner—George Fourson
Assistant Examiner—Brook Kebede
(74) Attorney, Agent, or Firm—Kinney & Lange, P.A.

(57) ABSTRACT

The present invention provides an over-voltage protection circuit using a Zener diode and transistor. By disposing at least one junction region of the Zener diode outside of the base region of the transistor, a tight (i.e., with small variation) and suitably high reverse breakdown voltage is achieved.

32 Claims, 5 Drawing Sheets

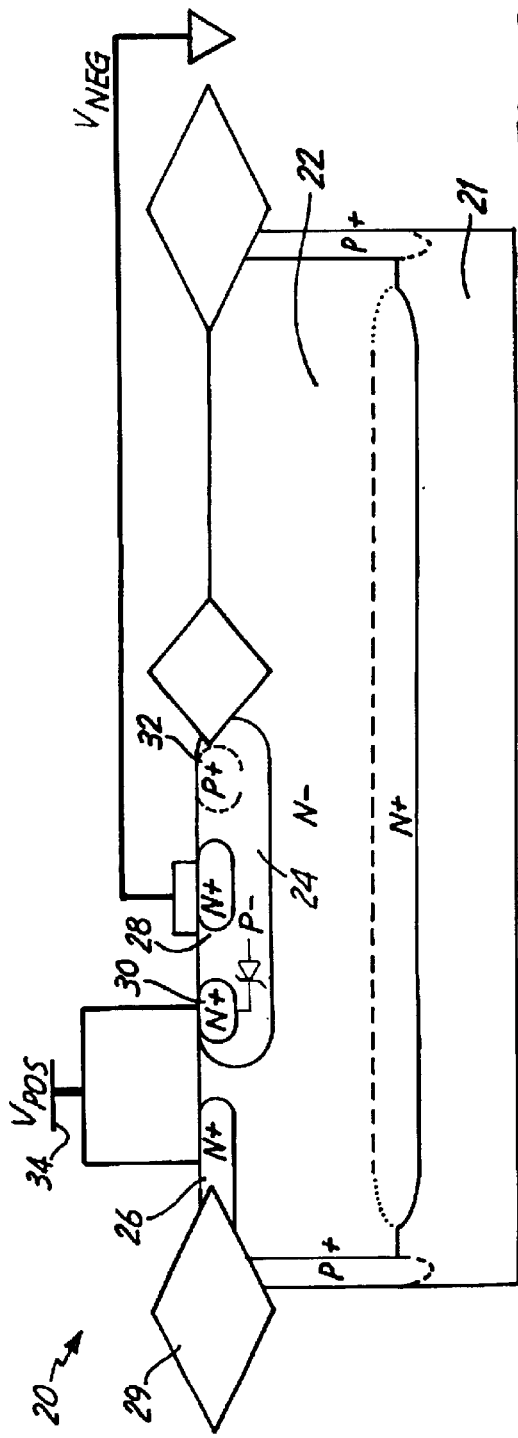
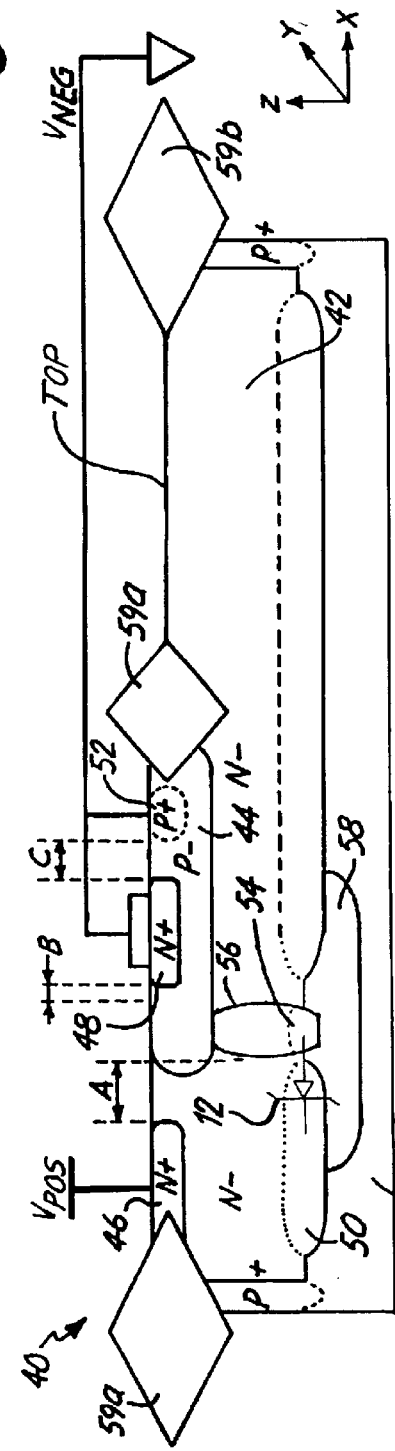
Fig. 2
Fig. 3

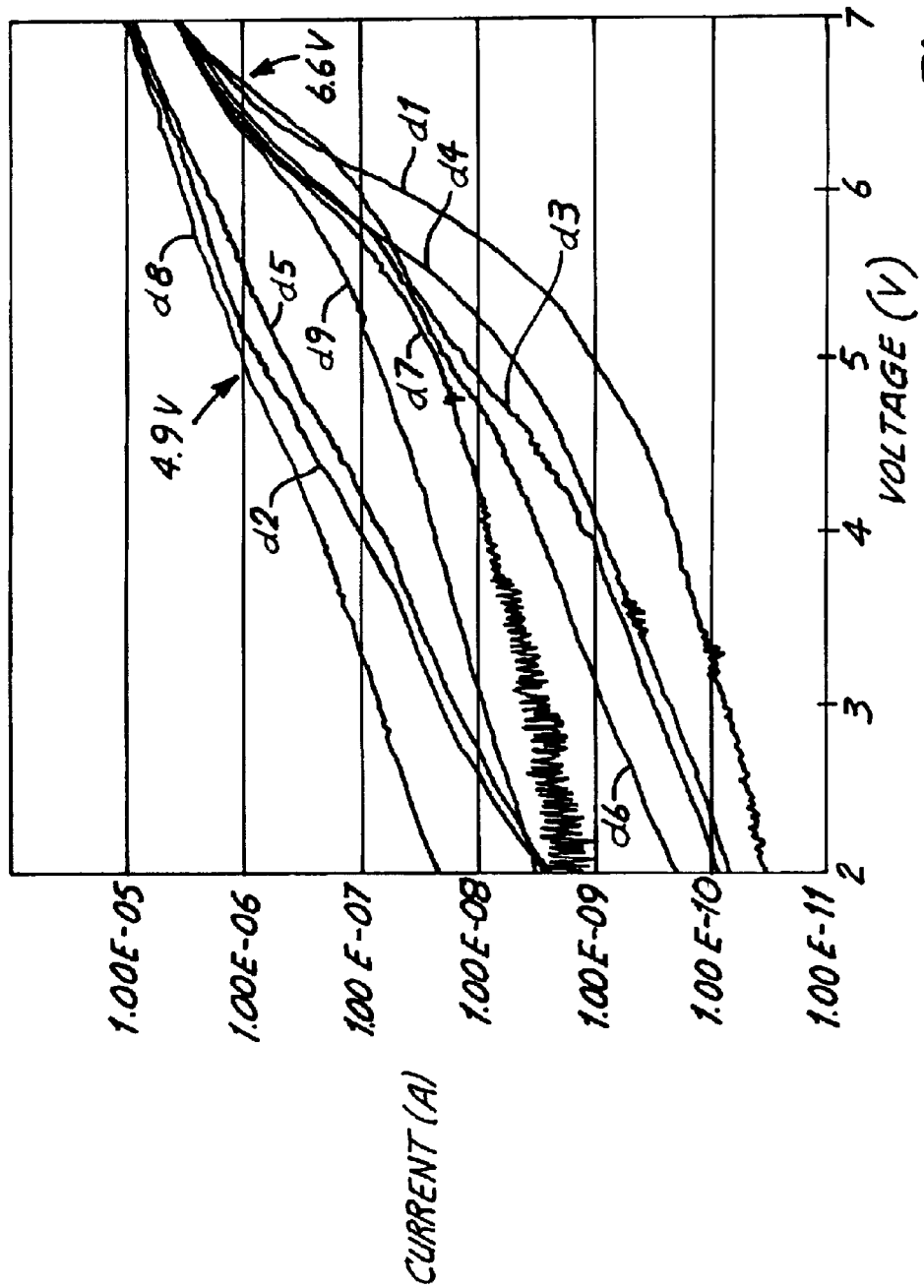

ELECTROSTATIC DISCHARGE PROTECTION CIRCUIT

BACKGROUND OF THE INVENTION

The present invention generally relates to semiconductor integrated circuit technology. More particularly, the present invention relates to an integrated circuit for electrostatic discharge protection.

Random or transient over-voltage, most commonly in the form of electrostatic discharge (ESD), can harm or even permanently damage an integrated circuit. An ESD event is often associated with a sudden release of a large amount of energy that can easily damage sensitive integrated circuit (IC) components. Protection circuits that can handle such sudden surges of energy are therefore often integrated with sensitive IC components to dissipate the energy. Although electrostatic discharge protection circuits are most often used to protect input and output circuitry, other types of applications may also be necessary and possible.

The most commonly used ESD protection circuits are themselves integrated circuits and built as a part of a larger integrated circuit that has the components intended to be protected. The use of such electrostatic discharge protection circuits is known in the art, as taught, for example, in U.S. Pat. Nos. 5,850,095 and 6,268,649, and other references cited therein.

Although a complete ESD protection circuit may include multiple clamp stages, an essential part of the circuit often includes a Zener diode and a transistor as shown in FIG. 1, which is a schematic illustration of such a circuit. As shown in FIG. 1, the protection circuit 10 includes a Zener diode 12, a bipolar transistor 14, a resistor 16 and a pair of connection terminals 18 and 18'. Under a normal condition where the voltage between the connection terminals 18 and 18' is a relatively small positive voltage, Zener diode 12 is reverse-biased and is "off." As the voltage reaches a breakdown level, Zener diode 12 experiences a Zener breakdown and is turned on, As a current flows through Zener diode 12 and subsequently resistor 16, a voltage drop is created across resistor 16 and also across the base and the emitter of transistor 14, thus forward biasing the base-emitter junction and turning on transistor 14. When turned on, transistor 14 bypasses a large amount of current that would have been undertaken by the other part of the integrated circuit (not shown in the FIG. 1) and avoids potential damages to the integrated circuit that is meant to be protected.

Various designs have been proposed in the art to implement the above protection circuit. Examples of such designs are found in U.S. Pat. Nos. 5,850,095 and 6,268,649, and other references cited therein. Although prior art designs differ from each other, they can be characterized by a simplified scheme represented in FIG. 2.

FIG. 2 illustrates a cross-section of a typical prior art implementation of a protection circuit based on a Zener diode and a transistor. Protection circuit 20 is built on substrate 21 and has a N− type body layer 22, an implanted P− base region 24, N+ diffusion regions 26, 28, and 30, and P+ diffusion region 32. In this structure, N+ diffusion region 26, a part of P− base region 24 and N+ diffusion region 28 form a transistor that is represented by transistor 14 in FIG. 1. A path (not shown) in P− base region 24 leading to P+ diffusion region 32 forms a resistor that is represented by resistor 16 in FIG. 1, whereas N+ diffusion region 30 and a part of P− base region 24 form a Zener diode that is represented by Zener diode 12 in FIG. 1.

Specifically, according to the scheme illustrated in FIG. 2, trigger Zener diode 12 is effected by placing an N+ diffusion region 30 in a P+ base diffusion region 24. One of the problems of this configuration is that during the N+ implanting, plasma damages in localized areas often occur, causing trap states which result in inconsistency and variability in the silicon band gap in regions that form the PN junction of the Zener diode. Due to trap assisted tunneling, this inconsistency and variability in the silicon band gap can result in a large variability in leakage current as a function of voltage in a reverse biased Zener diode. The large variability in leakage current undermines the process of fabricating integrated circuits. Because the process of fabricating includes making multiple integrated circuits on the same wafer, and additionally a single integrated circuit may itself contain multiple protection circuits, the variability makes the behavior of the integrated circuit products unpredictable and less uniform. Furthermore, leakage currents in a reversed-biased Zener diode are a mixture of the avalanche and tunneling processes. Local area plasma damage that creates significant tunneling effect can therefore result in unacceptably low values, in addition to the large variability thereof, for reverse breakdown voltages of the Zener diodes.

BRIEF SUMMARY OF THE INVENTION

The present invention is an over-voltage protection circuit. The over-voltage protection circuit includes a semiconductor body layer having a first type conductivity, a semiconductor transistor contacting the body layer, and a semiconductor diode formed in the body layer. The transistor has a base region of a second type conductivity opposite to the first type conductivity, a collector region of the first type conductivity and an emitter region of the first type conductivity. The diode has a junction of a first semiconductor region having the first type conductivity and a second semiconductor region having the second type conductivity. The first region of the diode junction is conductively connected to the collector region of the transistor. The second region of the diode junction is conductively connected to the emitter region of the transistor. According to the present invention, the first region of the diode is disposed outside of the base region of the transistor.

In one embodiment, both the first and the second regions of the diode are disposed outside of the base region of the transistor. In another embodiment, both the first and the second regions of the diode are disposed below the base region of the transistor. In yet another embodiment, the first and the second regions of the diode are buried layers disposed outside of the base region of the transistor and forming a side-by-side junction.

BRIEF DESCRIPTION OF THE DRAWINGS

FIG. 2 is a cross-section of the prior art implementation of the circuit illustrated in FIG. 1.

FIG. 3 is a cross-section of a first over-voltage protection circuit in accordance with the present invention.

FIG. 6 is a graph of leakage-current/voltage curves demonstrated by a group of nine over-voltage protection devices based on prior art designs.

DETAILED DESCRIPTION

Figure 1:
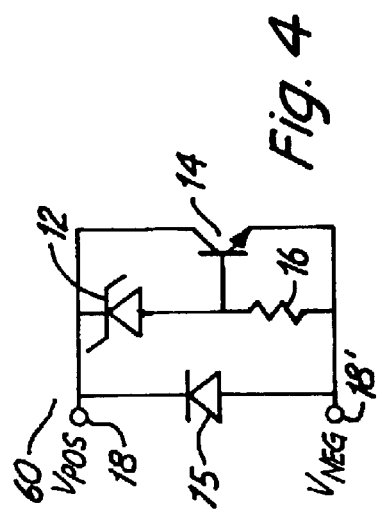
FIG. 1 is a schematic diagram illustrating a conventional overvoltage protection circuit.

The present invention is a novel implementation of a conventional ESD protection circuit. FIG. 3 shows a cross-section of the ESD protection circuit 40 in accordance with the present invention, in contrast with FIG. 2 which shows a cross-section of a prior art ESD protection circuit 20 as described previously. Although both prior art ESD protection circuit 20 and inventive ESD protection circuit 40 can be represented by the schematic diagram shown in FIG. 1, there are important structural differences between them as illustrated below with reference to FIG. 3.

As shown in FIG. 3, ESD protection circuit 40 has an overall vertical dimension Z, lateral dimensions X and Y, and a top surface TOP. Protection circuit 40 is built on P substrate 41, and has a N− type body layer 42, an implanted P+ base region 44, N+ diffusion regions 46 and 48, and P+ diffusion region 52. Diffusion regions 46, 48 and 52 are close to the top surface TOP. N+ diffusion region 46, a part of P− base region 44 and N+ diffusion region 48 form a transistor that is represented by transistor 14 in FIG. 1. A path (not shown) in P+ base region 44 leading to P+ diffusion region 52 forms a resistor that is represented by resistor 16 in FIG. 1. In contrast to protection circuit 20 in FIG. 2, N type layer 50 disposed outside of P− base region 44, instead of N+diffusion region 30 (FIG. 2) implanted in P− base region 44, is used to effect the cathode of Zener diode 12 in FIG. 1.

In the embodiment shown in FIG. 3, N type layer 50 is a buried layer disposed below P− base region 44. The embodiment in FIG. 3 further has P type buried layer 54 which effects the anode of the trigger Zener diode 12 in FIG. 1, and P type sinker 56 which is placed upon P type buried layer 54 to connect it to P− base region 44. In addition, N type well 58 is placed under P type buried layer 54 to separate it from P substrate 41.

Diffusion regions 46, 48 and 52 each have an electric contact (not shown). N+ diffusion region 46 is subject to a positive voltage VPOs through the electric contact thereon. N+ diffusion region 48 and P+ diffusion region 52 are further terminated together through the electric contacts thereon and subject to a negative voltage $V_{NEG}$. Under a normal condition, the Zener diode (PN junction) formed between the N buried layer 50 and P buried layer 54 is reverse-biased and is in an "off" status. As the voltage difference $V_{POS}$−$V_{NEG}$ increases and reaches a critical level, such as in an event of ESD, Zener diode 12 breaks down to allow a current through the PN junction between N buried layer 50 and P buried layer 54. The current flows through P sinker 56 and passes through P− base region 44 to P+ diffusion region 52. The flow of the current in P− base region 44 to P+ diffusion region 52 creates a voltage drop across the region and thus forward-biases the PN junction between P− base region 44 and N+ diffusion region 48 and turn on transistor 14 (FIG. 1) formed by N+ diffusion region 46, a part of P− base region 44 and N+ diffusion region 48. The above sequence of events allows a large amount of the ESD current to be shunned through transistor 14 and thus protect rest of the integrated circuit (not shown).

Figure 4:
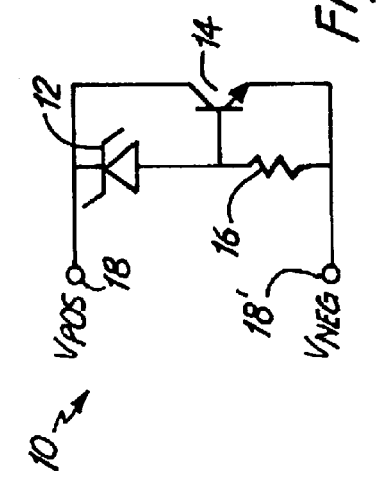
FIG. 4 is a schematic diagram illustrating a second over-voltage protection circuit in accordance with the present invention.
Figure 5:
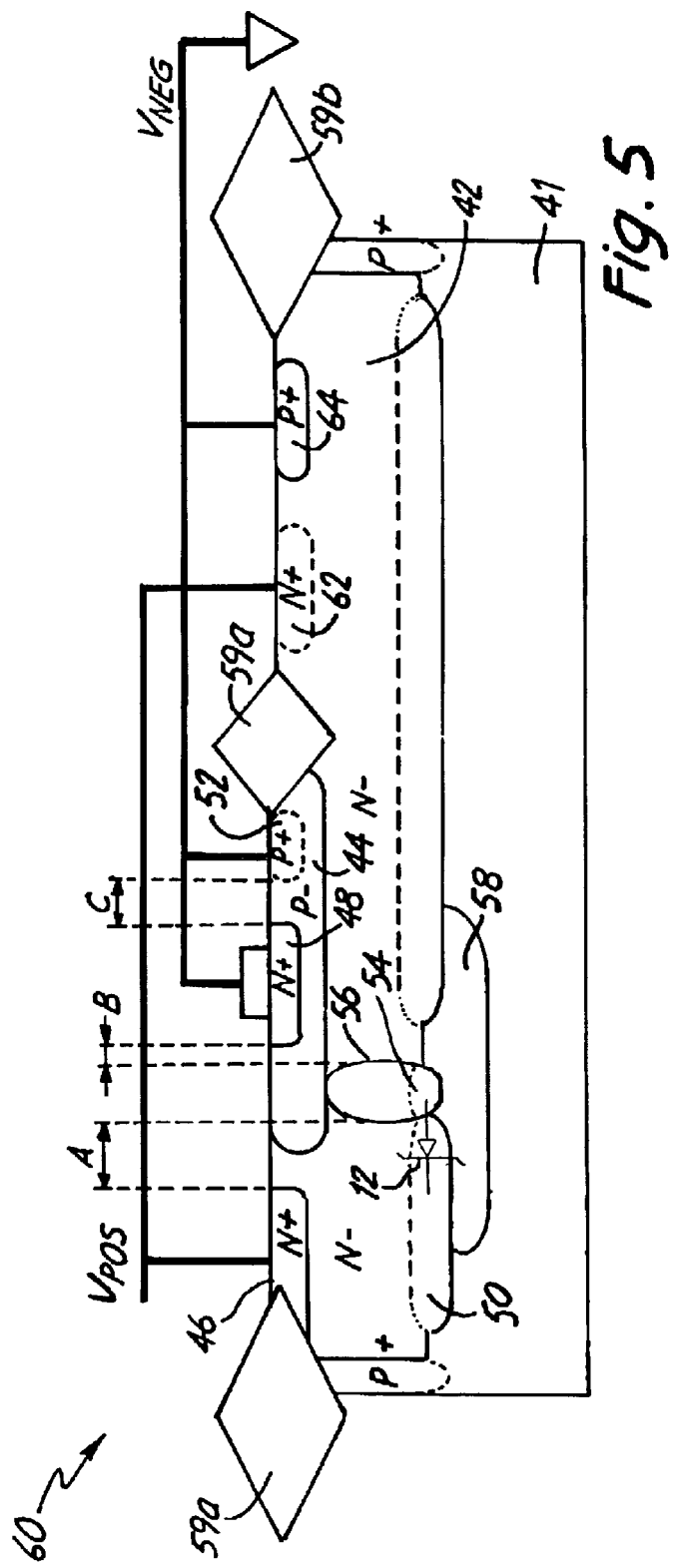
FIG. 5 is a cross-section of the second over-voltage protection circuit in accordance with the present invention.

The protection circuit 40 may be further improved by adding an additional diode to achieve bidirectional operation. FIG. 4 is a schematic diagram of such a protection circuit 60. FIG. 5 is a cross-section of protection circuit 60 in accordance with the present invention. For clarity, similar components are denoted using same or similar numbers in FIG. 4 and FIG. 2, and similar components are denoted using same or similar numbers in FIG. 5 and FIG. 3. As shown in FIG. 5, protection circuit 60 has a basic structure similar to that of protection circuit 40, but further includes N+ diffusion region 62 and P+ diffusion region 64. With N+ diffusion region 62 terminated together with N+ diffusion region 46, and P+ diffusion region 64 terminated together with N+ diffusion region 48, these additional diffusion regions form a diode represented as diode 15 in the schematic diagram in FIG. 4. This design allows electric current to be bypassed through diode 15 in an event where a negative voltage difference is applied across N+ diffusion region 46 (collector of transistor 14 and $V_{pos}$ terminal) and N+ diffusion region 48 (emitter of transistor 14 and $V_{NEG}$ terminal).

Lateral spacings A, B, and C are shown in FIGS. 3 and 5 as design considerations and will be discussed further later.

An exemplary composite ESD protection device in accordance with the present invention (FIGS. 4–5) is fabricated in a 0.8 μm BICMOS process. As shown in FIG. 5, the ESD device 60 has P− substrate 41 which underlies N+ buried layer 50 and N well layer 58. N well layer 58 is formed first using N type phosphorus. N+ buried layer 50 is formed next using N type arsenic. N+ buried layer 50 becomes the cathode of the buried Zener diode 12 in addition to electrically isolating N− epitaxial body layer 42 from P− substrate 41. P buried layer 54 is then formed using medium doped boron. P+ buried layer 54 becomes the anode of Zener diode 12 in addition to providing field isolation around the circumference of the device. An N− type epitaxial growth takes place over all diffusion regions to form N− epitaxial layer 42. P sinker 56 is then implanted using medium dose boron in order to provide a link-up from P buried layer 54 to an upper region, such as P base 44 to be formed. The implantation of P sinker 56 effects field isolation and electrical contact to the P+ base 44 of protection circuit 60. A suitable oxide layer 59a such as SiO2 is grown over the field area. An addition oxide layer 59b is grown along the length of the devices to electrically isolate the diode 15 from the rest of the circuitry. Oxide layers 59a and 59b define an open active region (not shown in the cross-section view in FIG. 5). P− base 44 is implanted into the open active region. An area is opened in the thin SiO2 layer 59a of the active region to accommodate the poly-silicon diffusion which will form N+ diffusion region 48, which is the emitter of transistor 14 in protection circuit 60. Poly-silicon forming the NPN emitter is then deposited on N+ diffusion region 48, doped and etched. Heavily arsenic doped N+ shallow implants are then used to form N+ diffusion region 46 which is the NPN collector of transistor 14, and N+ diffusion region 62 which is the cathode of diode 15 as shown schematically in FIG. 4. Heavily boron doped P+ implants are used to form P+ diffusion regions 64 and 52 which are the anode of diode 15 and the base contact of the NPN transistor 14, respectively. Electrical contacts, such as metal contacts, are then made on the collector, the emitter and the base of transistor 14 (diffusion regions 46, 48 and 52 respectively), and the cathode and the anode of diode 15 (diffusion regions 62 and 64 spectrally).

Although not required, integrated (instead of separately formed) Zener diode 12 and diode 15 are preferred in order to increase spatial efficiency which reduces demand for silicon space.

A protection circuit such as protection circuit 60 built in accordance with the present invention was shown to successfully raise the reverse breakdown voltage and tighten up the reverse voltage break-down distribution, thus overcoming the disadvantages of prior art devices.

Figure 7:
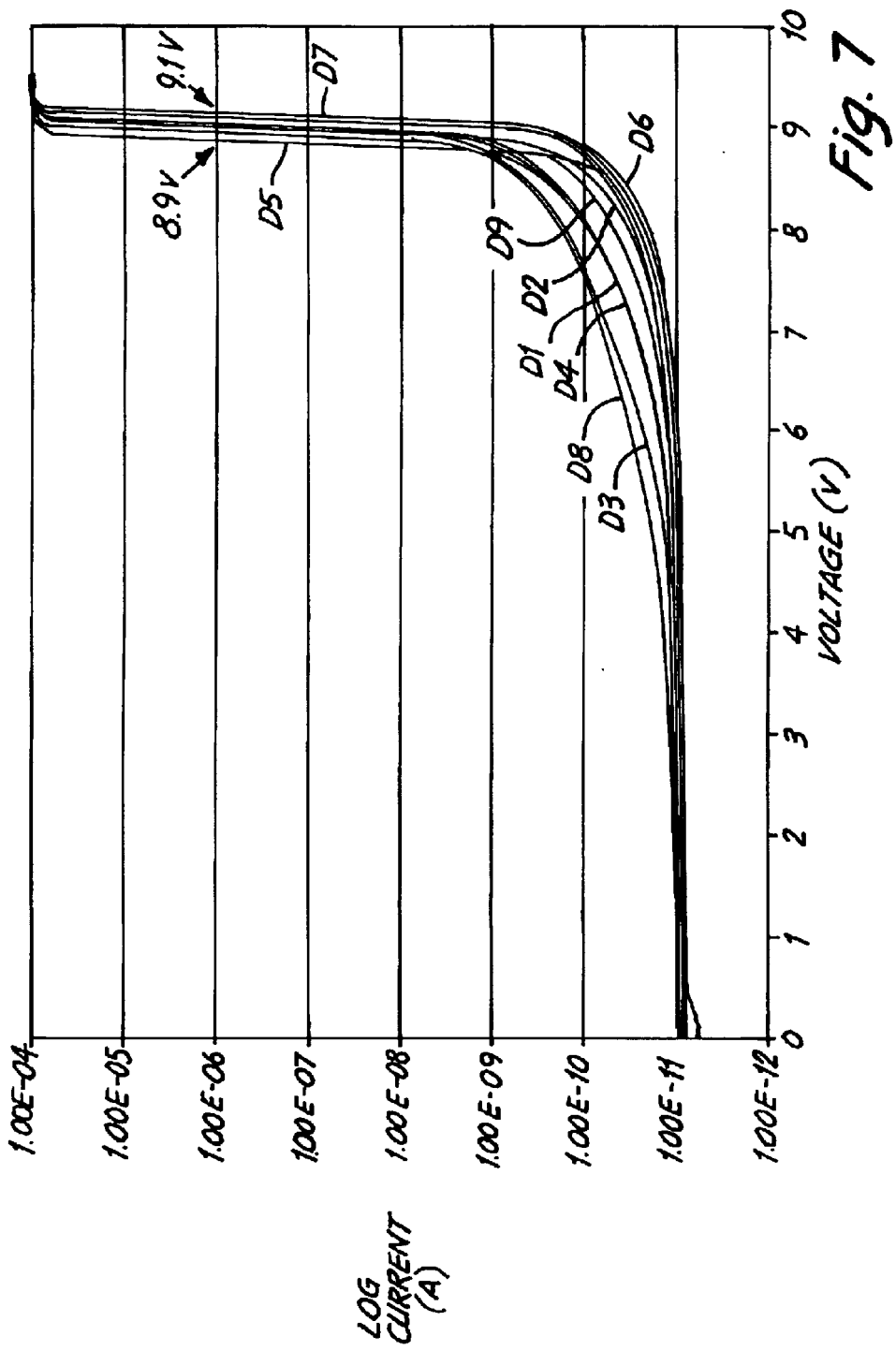
FIG. 7 is a graph of leakage-current/voltage curves demonstrated by a group of nine over-voltage protection devices in accordance with the present invention.

The characteristics of the inventive device are shown in FIGS. 6–7 in comparison with that of a prior art device.

FIG. 6 shows current/voltage curves d1–d9 of a group of nine devices based on prior art design. The x-axis represents the voltage across the Zener diode, and the y-axis represents leakage current flowing through the Zener diode. As shown in FIG. 6, the nine devices showed a first breakdown voltage ranging from 4.9V to 6.6V. This indicates that the first breakdown voltage is inconsistent (with a large variation of 1.7V), and undesirably low overall.

FIG. 7 shows current/voltage curves D1–D9 of a group of nine devices in accordance with the present invention. The x-axis represents the voltage across the Zener diode 12, and the y-axis represents leakage current flowing through the Zener diode 12. As shown in FIG. 7, the nine devices showed a first breakdown voltage ranging from 8.9V to 9.1V. This indicates that the first breakdown voltage of over-voltage protection circuits made in accordance with the present invention is not only highly consistent (with a small variation of 0.2V), but is also at an overall suitable level.

Figure 8:
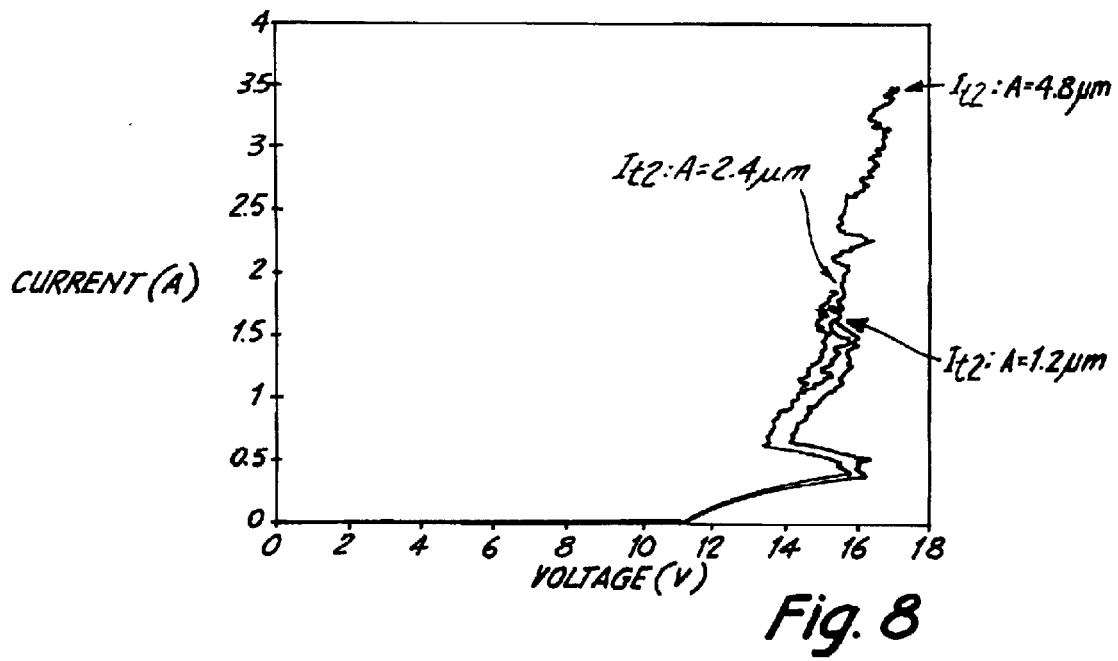
FIG. 8 is a graph of a first group of leakage-current/voltage curves demonstrating performance behavior of over-voltage protection devices in accordance with the present invention with various design parameters.

Lateral spacings A, B, and C as design considerations shown in FIGS. 3 and 5 may be varied in the design of the NPN ESD device in accordance with the present invention. Varying spacing A directly affects the $I_{12}$ value of the protection circuit 40. $I_{12}$ is the maximum ESD current a device can pass before the device goes into a second breakdown which may catastrophically destroy the device. FIG. 8 is a graph illustrating the effect on $I_{12}$ as lateral spacing A is varied from 1.2, 2.4, to 4.8 µm. The results indicate that the value of $I_{12}$ increases with the value of A spacing. This is explained by noting that the greater the value of A, the higher the resistance between the N+ collector implant 46 and the P– base 44. This resistance acts as a ballast resistance, forcing the total width of the device, as opposed to just a localized area, to conduct ESD current.

Figure 9:
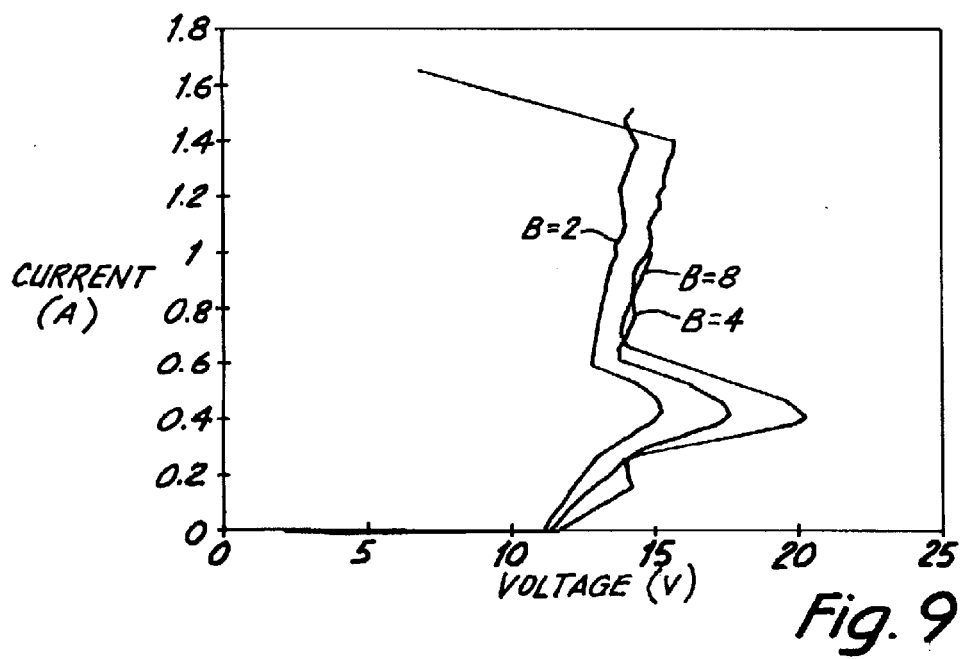
FIG. 9 is a graph of a second group of leakage-current/voltage curves demonstrating performance behavior of over-voltage protection devices in accordance with the present invention with various design parameters.

Varying the B spacing directly affects the snap-back voltage (a voltage at which the NPN goes into avalanche breakdown). FIG. 9 is a graph illustrating the effect on the snap-back voltage as the lateral spacing B is varied from 2, 4, to 8 µm. The results indicate that the lower the value of B spacing, the lower the snap-back voltage. This may be explained by noting that after breakdown of Zener diode 12, which is formed between P+ buried layer 54 and N+ buried layer 50, current flows up in P sinker 56, across the P– base 44 and exits P+ diffusion region 52 prior to the NPN breakdown. The further away the P sinker 56 and P+ buried layer 54 are from the N+ emitter (diffusion region 48), the more series resistance is created, hence a higher turn-on voltage.

Data indicated that varying spacing C had no significant effect on device performance.

As shown in the above example, an ESD protection device built in accordance with the present invention demonstrated a reverse breakdown voltage that is both sufficiently high and consistent without significant variation, overcoming the deficiencies of devices built in accordance with the prior art designs. Although the present invention is not bound by the validity of any theory for explaining its operation, it is believed that the advantage over the prior art designs relates to the novel design of the present invention in the following manner: by forming the N region (N type layer 50 in FIGS. 3 and 5) of Zener diode 12 outside of the base region (P– base region 44 in FIGS. 3 and 5) of transistor 14, and more preferably forming the entire Zener diode 12 outside of P– base region 44, local area plasma damage near the PN junction of the Zener diode 12 is limited. As a result, band gap vibrations and the related trap assisted tunneling are reduced or avoided. As explained previously, the above characteristics are expected to both reduce the variation of breakdown voltage of the Zener diodes and increase the overall level of the same.

Although the present invention has been described with reference to preferred embodiments, workers skilled in the art will recognize that changes may be made in form and detail without departing from the spirit and scope of the invention. Particularly, it should be noted that designs shown in FIGS. 3 and 5 only represents specific embodiments of the present invention. Other variations, even if less preferred, maybe possible. For example, it is possible to build a similar device with the conductivity type reversed. In addition, because the essence of the invention is to place at least part of the Zener diode outside of the base region of the protection transistor, the present invention is equally applicable in combination with a protection transistor of a type other than a bipolar transistor illustrated in the examples herein.

What is claimed is:

1. An over-voltage protection circuit, comprising:
   a semiconductor body layer having a first type conductivity;
   a semiconductor transistor contacting the body layer, the transistor comprising a base region of a second type conductivity opposite to the first type conductivity, a collector region of the first type conductivity and an emitter region of the first type conductivity; and
   a semiconductor diode formed in the body layer, the diode comprising a junction of a first semiconductor region having the first type conductivity and a second semiconductor region having the second type conductivity, the first region being conductively connected to the collector region of the transistor, and the second region being conductively connected to the emitter region of the transistor, wherein the first region of the diode is disposed outside of the base region of the transistor.

2. The protection circuit of claim 1, wherein the first conductivity type is N type.

3. The protection circuit of claim 2, wherein the first conductive type is low doped N type (N– type).

4. The protection circuit of claim 1, wherein the body layer is an epitaxial layer.

5. The protection circuit of claim 1, wherein the second region of the diode is disposed outside of the base region and is conductively connected to the base region of the transistor.

6. The protection circuit of claim 1, wherein the first and the second regions of the diode are disposed side-by-side laterally.

7. The protection circuit of claim 1, wherein the first region of the diode comprises a buried layer.

8. The protection circuit of claim 1, wherein the second region of the diode comprises a buried layer.

9. The protection circuit of claim 8, wherein the buried layer is conductively connected to the base region of the transistor.

10. The protection circuit of claim 9, wherein the buried layer and the base region are connected through a sinker of the second type conductivity.

11. The protection circuit of claim 1, wherein the transistor is disposed in the body layer.

12. The protection circuit of claim 10, wherein the transistor is disposed near a top surface of the body layer and the diode is substantially disposed under the transistor.

13. The protection circuit of claim 1, wherein the base region of the transistor comprises a diffusion region.

14. The protection circuit of claim 1, wherein the collector region and the emitter region of the transistor each comprises a diffusion region.

15. The protection circuit of claim 1, further comprising:
a resistor contact region of the second type conductivity disposed in the base region of the transistor and in terminal contact with the emitter region of the transistor, thus forming a base resistor parallel to base-emitter junction of the transistor.

16. The protection circuit of claim 15, wherein the resistor contact region is a diffusion region with heavier dope of the second type conductivity than the base region of the transistor.

17. The protection circuit of claim 1, further comprising:
an additional diode having a first and second junction ends, the first junction end being in terminal contact with the collector region of the transistor and a second junction end being in terminal contact with the emitter region of the transistor.

18. The protection circuit of claim 17, wherein the first junction end comprises a diffusion region of the first type conductivity disposed in the body layer, and the second junction end comprises a diffusion region of the second type conductivity disposed in the body layer.

19. The protection circuit of claim 1, wherein the body layer is formed on a semiconductor substrate of the second type conductivity.

20. The protection circuit of claim 19, further comprising:
a buried layer of the first type conductivity disposed between the body layer and the substrate.

21. An over-voltage protection circuit, comprising:
a semiconductor substrate of a first type conductivity;
a first semiconductor layer of a second type conductivity above the substrate;
a second semiconductor layer of the first type conductivity above the substrate, the second semiconductor layer forming a PN junction with the first semiconductor layer;
a semiconductor body layer of the second type conductivity above the first semiconductor layer;
a semiconductor base layer of the first type conductivity implanted in the body layer, wherein the base layer is disposed above the second semiconductor layer and conductively connected to, and is spaced from the first semiconductor layer;
a third semiconductor layer of the second type conductivity implanted in the body layer and disposed on top of the first semiconductor layer; and
a fourth semiconductor layer of the second type conductivity implanted in the base layer, wherein the third semiconductor, the fourth semiconductor and the semiconductor base layers form a transistor.

22. The protection circuit of claim 21, wherein the first type conductivity is P type.

23. The protection circuit of claim 21, wherein the first semiconductor layer is a buried layer.

24. The protection circuit of claim 21, wherein the second semiconductor layer is a buried layer.

25. The protection circuit of claim 21, wherein the semiconductor body layer is an epitaxial layer.

26. The protection circuit of claim 21, further comprising:
a semiconductor well of the second type conductivity underlying the second semiconductor layer and separating the second semiconductor layer from the substrate.

27. The protection circuit of claim 21, wherein the first semiconductor layer and the second semiconductor layer are disposed side by side laterally, the base layer is vertically spaced from the first semiconductor and the second semiconductor layers, and the base layer is connected to the second semiconductor layer by a semiconductor sinker of the first type conductive.

28. The protection circuit of claim 21, wherein the third semiconductor layer and the base layer are disposed side-by-side and laterally spaced from each other.

29. The protection circuit of claim 21, wherein the fourth semiconductor layer and the second semiconductor layer are electrically spaced from each others.

30. The protection circuit of claim 21, further comprising:
a fifth semiconductor layer of the first type conductivity implanted in the base layer and terminally connected with the fourth semiconductor layer, thus forming a resistor parallel to a PN junction formed between the base layer and the fourth semiconductor layer.

31. The protection circuit of claim 30, wherein the fourth semiconductor layer and the fifth semiconductor layer are disposed side by side and laterally spaced from each other.

32. The protection circuit of claim 21, further comprising:
a sixth semiconductor layer of the first type conductivity implanted in the body layer; and a seventh semiconductor layer of the second type conductivity implanted in the body layer, wherein the sixth semiconductor layer is terminally connected to the fourth semiconductor layer, and the seventh semiconductor layer is terminally connected to the first semiconductor layer.

* * * * *

UNITED STATES PATENT AND TRADEMARK OFFICE
CERTIFICATE OF CORRECTION

PATENT NO. : 6,768,176 B1
DATED : July 27, 2004
INVENTOR(S) : David D. Litfin

Page 1 of 1

It is certified that error appears in the above-identified patent and that said Letters Patent is hereby corrected as shown below:

Column 1,
Line 26, delete "6,268,649", insert -- 6,268,639 --

Column 4,
Line 29, delete "BICMOS", insert -- BiCMOS --

Signed and Sealed this

Twenty-sixth Day of July, 2005

JON W. DUDAS
*Director of the United States Patent and Trademark Office*